(12) United States Patent
Hashimoto

(10) Patent No.: US 10,992,376 B2
(45) Date of Patent: Apr. 27, 2021

(54) WORK MACHINE

(71) Applicant: FUJI CORPORATION, Chiryu (JP)

(72) Inventor: Mitsuhiro Hashimoto, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/959,334

(22) PCT Filed: Jan. 16, 2018

(86) PCT No.: PCT/JP2018/001001
§ 371 (c)(1),
(2) Date: Jun. 30, 2020

(87) PCT Pub. No.: WO2019/142236
PCT Pub. Date: Jul. 25, 2019

(65) Prior Publication Data
US 2020/0358526 A1    Nov. 12, 2020

(51) Int. Cl.
| | | |
|---|---|---|
| H04B 10/00 | (2013.01) | |
| H04B 10/079 | (2013.01) | |
| G02B 6/43 | (2006.01) | |
| H04B 10/25 | (2013.01) | |
| H05K 13/04 | (2006.01) | |
| H04J 14/00 | (2006.01) | |

(52) U.S. Cl.
CPC ............ *H04B 10/079* (2013.01); *G02B 6/43* (2013.01); *H04B 10/25* (2013.01); *H05K 13/046* (2013.01)

(58) Field of Classification Search
CPC .... H04B 10/07; H04B 10/075; H04B 10/079; H04B 10/0795; H04B 10/07953; H04B 10/07955
See application file for complete search history.

(56) References Cited

U.S. PATENT DOCUMENTS 10,461,851 B1 * 10/2019 Zeng .................. H04B 10/0791

FOREIGN PATENT DOCUMENTS

| CN | 104301031 A | 1/2015 |
|---|---|---|
| JP | 9-116231 A | 5/1997 |
| JP | 11-225115 A | 8/1999 |
| JP | 2001-51168 A | 2/2001 |
| JP | 2001-108860 A | 4/2001 |
| JP | 2002-72007 A | 3/2002 |

(Continued)

OTHER PUBLICATIONS

International Search Report dated Apr. 10, 2018 in PCT/JP2018/001001 filed Jan. 16, 2018, 2 pages.

*Primary Examiner* — Daniel G Dobson
(74) *Attorney, Agent, or Firm* — Oblon, McClelland, Maier & Neustadt, L.L.P.

(57) ABSTRACT

The object is to provide a technique for predicting a time for performing maintenance of optical communication in an electronic component mounting device in which optical communication is performed. A controller in a time prediction process reads the voltage of an electrical signal from a storage section, calculates the slope with respect to time of the read voltage, and based on the amount of decrease with time of the voltage outputted from an AD converter, the time at which the voltage becomes to be equal to or less than a threshold value is calculated. The time at which the output value of the optical signal outputted from the mounting head will become equal to or less than the threshold value is then estimated.

9 Claims, 3 Drawing Sheets

(56) References Cited

FOREIGN PATENT DOCUMENTS

| | | |
|---|---|---|
| JP | 2003-8136 A | 1/2003 |
| JP | 2016-31975 A | 3/2016 |
| JP | 2016-152483 A | 8/2016 |
| JP | 2017-183587 A | 10/2017 |
| JP | 2017-213629 A | 12/2017 |

* cited by examiner

WORK MACHINE

TECHNICAL FIELD

The present application relates to a work machine for performing optical communication.

BACKGROUND ART

For a system comprising a control device and a movable unit controlled by the control device, Patent Literature 1 discloses a technique for causing the control device and the movable unit to perform an appropriate process when the transmission path for transmitting control information transmitted from the control device is disconnected.

PATENT LITERATURE

Patent Literature 1: JP-A-2016-31975

BRIEF SUMMARY

Technical Problem

In an optical communication system using an optical fiber in the transmission path, an electro-optical converter, a photoelectric converter, and the like are used. When the amount of light output transmitted by the optical fiber is reduced due to deterioration with time of the electro-optical converter, it is possible for a communication failure to occur. Therefore, there has been demand for a technique that predicts the time to perform maintenance of a communication system before communication failure occurs.

The present application has been proposed in view of the above-mentioned problem, and an object thereof provides a technique to predict the time for performing maintenance of an optical communication in an electronic component mounting device in which optical communication is performed.

Solution to Problem

The present specification includes: a fixed unit, a movable unit movably provided in the fixed unit, an optical transmission path configured to transmit an optical signal between the fixed unit and the movable unit, a first photoelectric converter configured to convert the optical signal outputted from the movable unit into an electrical signal, a first detection section configured to detect the signal value of the electrical signal converted by the first photoelectric converter, and a first estimation section configured to estimate a time at which the output value of the optical signal outputted from the movable unit becomes to be equal to or less than a threshold value based on the signal value of the electrical signal with time detected by the first detection section.

Advantageous Effects

The signal value of the electrical signal converted by the photoelectric converter changes in accordance with the output value of the optical signal. Therefore, according to the present disclosure, it is possible to provide a work machine that predicts a time for performing maintenance at which the output value of the optical signal will become equal to or less than the threshold value.

DESCRIPTION OF EMBODIMENTS

Configuration of the Mounting Device

Figure 1:
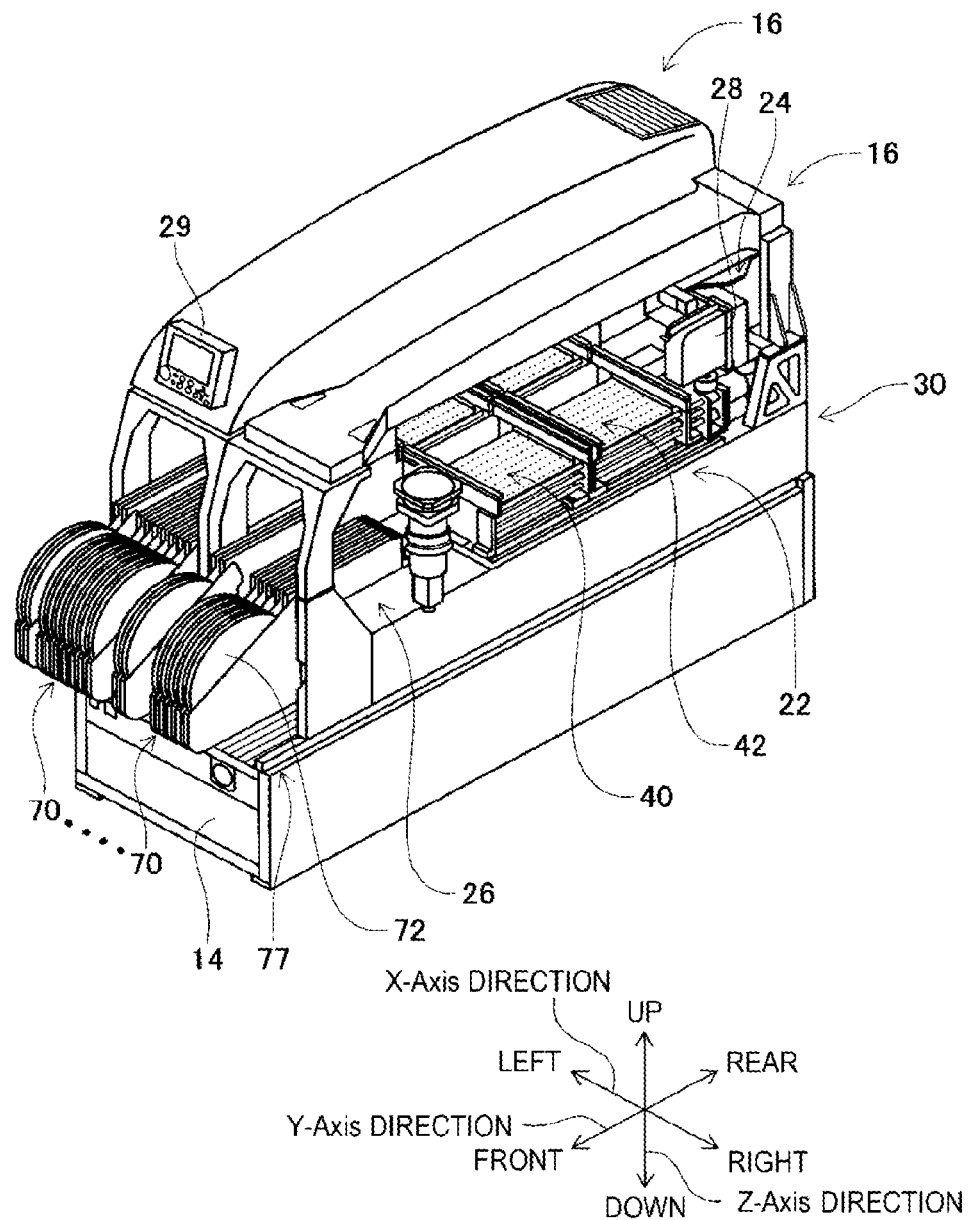
FIG. 1 A perspective view of an electronic component mounting device.

Mounting device 16 will be described with reference to FIG. 1. Mounting device 16 performs a mounting work for mounting an electronic component to a board such as a printed circuit board. Various devices such as mounting device 16, conveyance device 22, supply device 26, and mounting head 28 are mounted on common base 14. In the following description, as shown in FIG. 1, the direction in which mounting device 16 is aligned is the X-axis direction, the direction perpendicular to the X-axis direction in parallel with the plane of the conveyed board is the Y-axis direction, and the direction perpendicular to both the X-axis direction and the Y-axis direction is the Z-axis direction. Further, display device 29 is provided on the front of mounting device 16. Display device 29 displays, for example, information such as the operation state of mounting device 16.

Conveyance device 22 includes two conveyor devices 40, 42 and board holding device (FIG. 2) 48. Two conveyor devices 40, 42 extend in the X-axis direction and are provided parallel to each other on frame section 30. Each of the two conveyor devices 40, 42 conveys a board, supported by each conveyor device 40, 42, in the X-axis direction with conveyor motor 46 (FIG. 2) as a driving source. Board holding device 48 (FIG. 2) pushes up and secures the conveyed board to a predetermined position.

Moving device 24 includes a Y-axis direction slide mechanism, an X-axis direction slide mechanism (not shown), and the like. The Y-axis slide mechanism has a pair of guide rails extending in the Y-axis direction, a slider, Y-axis motor 62 (refer to FIG. 2), and the like which are not shown in the figure. The slider moves to any position in the Y-axis direction, while being guided by the guide rails, in response to the drive of Y-axis motor 62. Similarly, the X-axis direction slide mechanism has a pair of guide rails extending in the X-axis direction, a slider, X-axis motor 64 (FIG. 2), and the like which are not shown in the figure. Guide rails of the X-axis direction slide mechanism are fixed to the slider of the Y-axis direction slide mechanism, and the slider of the X-axis direction slide mechanism moves to any position in the X-direction, while being guided by the guide rails, in response to the drive of X-axis motor 64. Mounting head 28, for picking up an electronic component and mounting the electronic component on a board, is detachably and movably fixed to the slider of the X-axis direction slide mechanism.

Supply device 26 is a feeder-type supply device and is disposed at the front of frame section 30. Supply device 26 includes multiple tape feeders 70. Tape feeder support base 77 for supporting tape feeders 70 is disposed at the front of frame section 30, and tape feeders 70 are supported on tape feeder support base 77. Each tape feeder 70 opens while pulling out the component tape wound around reel 72 and supplies electronic components to the downstream side of tape feeder 70.

Mounting head 28 consists of a suction nozzle (not shown), positive and negative pressure supply device 52 (FIG. 2), nozzle lifting and lowing device 54 (FIG. 2), nozzle rotation device 56 (FIG. 2), mark camera 164 (FIG. 2), side camera 165 (FIG. 2), and the like. The suction nozzle is mounted on the lower face of mounting head 28. Further, mounting head 28 has a supply path for supplying negative pressure air from positive pressure air from positive and negative pressure supply device 52. With this configuration, mounting head 28 can pick up and hold an electronic component by being supplied with negative pressure air, and mounting head 28 can release the held electronic component by being supplied with slightly positive pressure air. Nozzle lifting and lowering device 54 raises and lowers the suction nozzle, and nozzle rotation device 56 rotates the suction nozzle about an axis. With this configuration, the suction nozzle can change the position in the up-down direction and the holding orientation of the held electronic component. Mark camera 164 captures an image of, for example, board ID written on a board from above. Side camera 165 captures an image, from the side, of an electronic component picked up by the suction nozzle.

Various types of mounting heads 28 are available. The various types of mounting heads 28 differ from each other, for example, in the number of suction nozzles. Mounting head 28 is detachable with respect to the slider of the X-axis direction slide mechanism, for example, and is exchanged depending on the electronic component to be mounted.

Next, the mounting work of mounting device 16 will be described. The board is conveyed to a predetermined position by conveyor devices 40, 42 and is secured by board holding device 48. On the other hand, moving device 24 moves mounting head 28 to supply device 26. Next, suction nozzle 57 is lowered to the position of the electronic component supplied by supply device 26, and picks up and holds the electronic component. Thereafter, suction nozzle 57 rises. Next, moving device 24 moves mounting head 28 to above the board mounting position. Next, suction nozzle 57 is lowered to the board position and releases the electronic component. In this way, mounting head 28 mounts the electronic component on the board.

Further, in order to perform the planned mounting work, for example, when the board is secured by board holding device 48, controller 141 checks whether board ID captured by mark camera 164 is in accordance with what is planned. Further, after controller 141 picks up the electronic component with suction nozzle 57, the image captured by side camera 165 is checked to determine whether the electronic component was dropped. If board ID is not what is planned, or if the electronic component has fallen, controller 141 determines that an error has occurred and suspends the mounting work.

Configuration of the Control System of the Mounting Device

Figure 2:
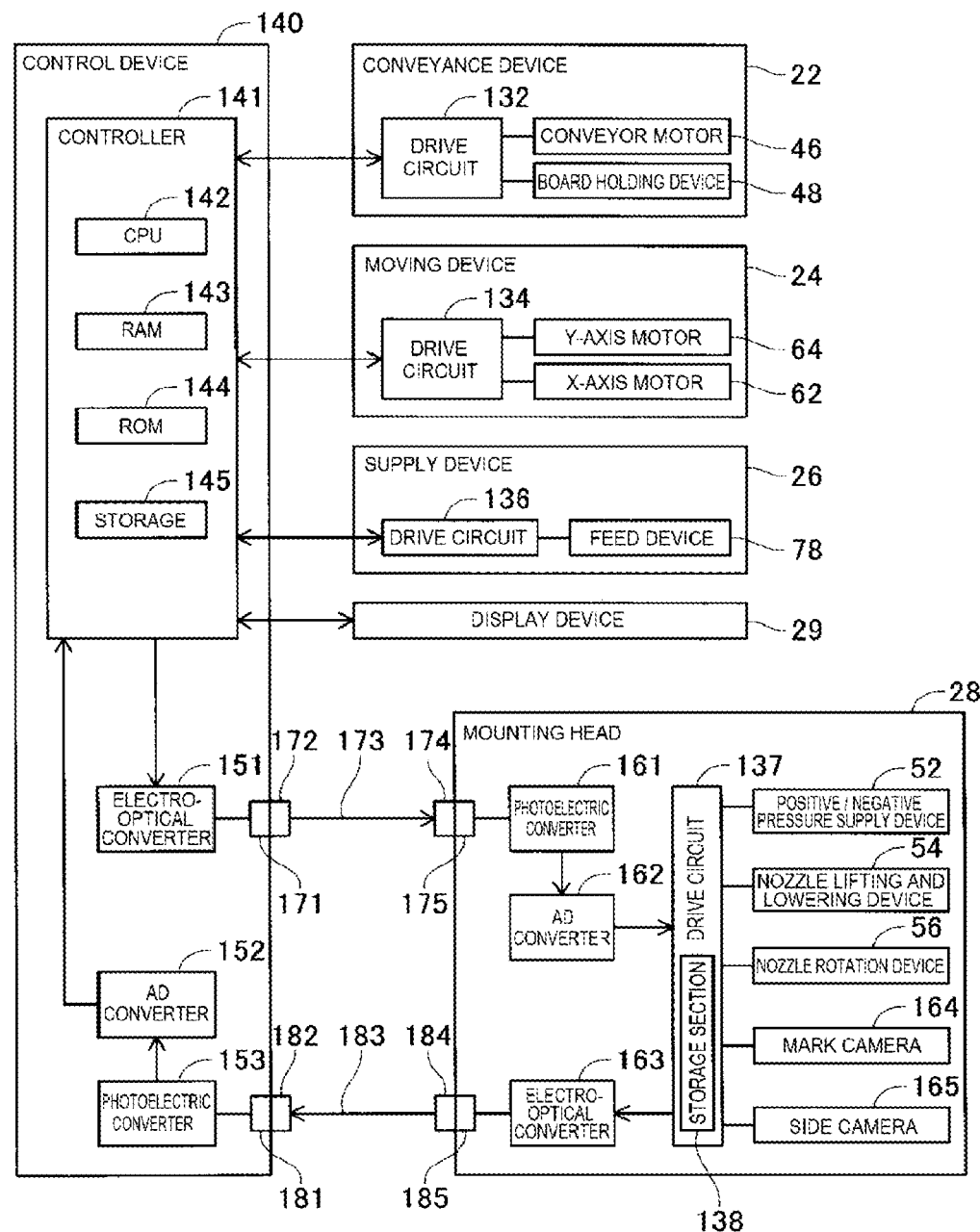
FIG. 2 A block diagram showing a control system of the electronic component mounting device.

With reference to FIG. 2, the configuration of the control system of mounting device 16 will be described. In addition to the above-described configuration, mounting device 16 includes control device 140 and the like. Control device 140 includes controller 141, electro-optical converter 151, AD converter 152, photoelectric converter 153, an amplifier (not shown), a low-pass filter (not shown), and the like. Controller 141 includes CPU 142, RAM 143, ROM 144, storage section 145, and the like. CPU 142 controls electrically connected sections by executing various programs stored in ROM 144. Here, these sections include conveyance device 22, moving device 24, mounting head 28, supply device 26, and the like. RAM 143 is used as a main memory when CPU 142 performs various processes. Control programs and various data are stored in ROM 144. Storage section 145 stores a program and the like for a time prediction process, which will be described later.

In addition to the configuration described above, conveyance device 22 includes drive circuit 132 for driving conveyor motor 46 and board holding device 48. In addition to the configuration described above, moving device 24 includes drive circuit 134 for driving X-axis motor 64 and Y-axis motor 62. In addition to the configuration described above, supply device 26 includes drive circuit 136 for driving feed device 78.

In addition to the configuration described above, mounting head 28 includes drive circuit 137, photoelectric converter 161, AD converter 162, electro-optical converter 163, amplifier (not shown), low-pass filter (not shown), and the like. Drive circuit 137 has storage section 138. Optical communication is generated between controller 141 and mounting head 28 using an optical fiber. Control device 140 is provided with connectors 171, 181, which are connectors for the fiber-optic cable. Further, mounting head 28 is provided with connectors 175, 185, which are connectors for the fiber-optic cable. Both ends of fiber-optic cable 173, used for communication from controller 141 to mounting head 28, are provided with connectors 172, 174. Fiber-optic cable 173 is a flexible two-core fiber. Both ends of fiber-optic cable 183 used for communication from mounting head 28 to controller 141, are provided with connector 182, 184. Connectors 172, 174 of fiber-optic cable 173 are connected to connector 171 of control device 140 and connector 175 of mounting head 28, respectively, so that control device 140 and mounting head 28 are optically connected. Further, connectors 182, 184 of fiber optic cable 183 are connected to connector 181 of control device 140 and connector 185 of mounting head 28, respectively, so that control device 140 and mounting head 28 are optically connected.

Connector 171 of control device 140 and electro-optical converter 151 are optically connected to each other, and connector 181 and photoelectric converter 153 are optically connected to each other. Electro-optical converter 151 converts the electrical signal outputted from controller 141 into an optical signal and outputs the optical signal to mounting head 28 via fiber-optic cable 173. Photoelectric converter 153 converts the optical signal outputted from mounting head 28 into an electrical signal. After the converted electrical signal is amplified by an amplifier (not shown), the amplified electrical signal is outputted to AD converter 152 via a low-pass filter (not shown). AD converter 152 converts the electrical signal, which is an analog value, into an electrical signal of a digital value and outputs the signal to controller 141. Further, AD converter 152 outputs a voltage value corresponding to the received analog electrical signal to controller 141.

Connector 185 of mounting head 28 is optically connected to electro-optical converter 163, and connector 175 is optically connected to photoelectric converter 161. Electro-optical converter 163 converts the electrical signal outputted from drive circuit 137 into an optical signal, and outputs the optical signal via fiber-optic cable 183 to control device 140. Photoelectric converter 161 converts the optical signal outputted from control device 140 into an electrical signal. After the converted electrical signal is amplified by an amplifier (not shown), the signal is outputted to AD converter 162 via a low-pass filter (not shown). AD converter 162 converts the electrical signal which is an analog value into an electrical signal of a digital value and outputs the signal to drive circuit 137. Further, AD converter 162 outputs a voltage value corresponding to the received analog electrical signal to drive circuit 137.

In the mounting work, CPU 142 outputs a control signal to mounting head 28 via fiber-optic cable 173. As the control signal, there are, for example, an imaging command signal to mark camera 164 and side camera 165, and a transferring command signal for the captured image. Further, drive circuit 137 outputs image data captured by mark camera 164 and side camera 165 to CPU 142 via fiber-optic cable 183 or the like. Although the amount of image data tends to be large, in the present embodiment, high-speed transmission is achieved by using fiber-optic cable 183 as the communication path. If a communication failure occurs, CPU 142 determines an error has occurred and stops mounting work. Therefore, before a communication failure occurs due to deterioration of the communication path over time, a notification for the time for performing maintenance is sent out by the time prediction process described below.

Figure 3:
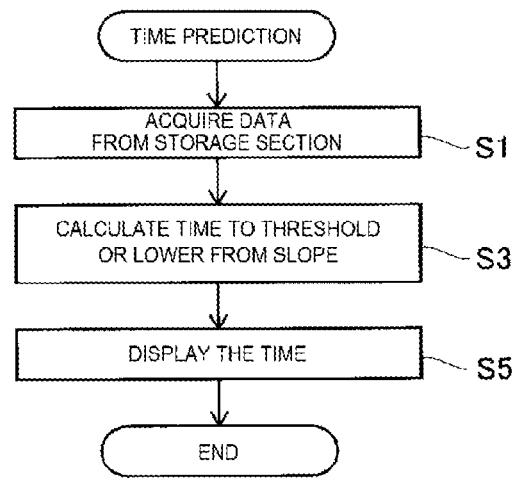
FIG. 3 A flowchart of a time prediction process.

CPU 142 executes a storage process for storing the voltage values outputted from A/D converter 152 in storage section 145 in association with the time, for example, after every predetermined amount of time while mounting work is performed. Thus, a voltage history is stored in storage section 145. The predetermined amount of time is, for example, several milliseconds. Further, drive circuit 137 of mounting head 28 stores the ID given to itself. CPU 142 causes mounting head 28 to transmit an ID when mounting head 28 is exchanged to verify whether the pre-planned mounting head 28 and the installed mounting head 28 are matched. When transmitted, the ID of the new mounting head 28 is stored in storage section 145 together with the time as history. Further, CPU 142 executes the time prediction process shown in FIG. 3, for example, after every predetermined amount of time while mounting work is performed. The predetermined amount of time is, for example, several hours. Next, the time prediction process will be described with reference to FIG. 3.

When starting the time prediction process, CPU 142 reads out and acquires the voltage values of electrical signals stored in storage section 145 from the time at which mounting head 28 was exchanged to the current time, and stores the voltage values in RAM 143 in step S1. More specifically, CPU 142 reads out the time at which current mounting head 28 was attached from storage section 145 and reads out the voltage values of electric signals from the time of attachment to the current time. Next, CPU 142 calculates the slope of the read voltage values with respect to time and then calculates the time at which the voltage value will become equal to or lower than the threshold (S3).

Figure 4:
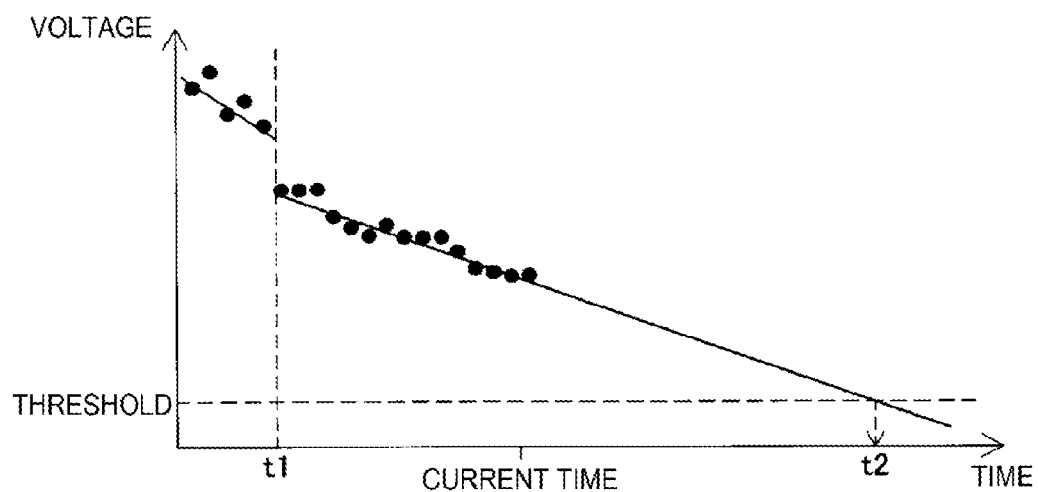
FIG. 4 A diagram schematically showing the change in voltage with time.

Steps S1 and S3 will be described with reference to FIG. 4. FIG. 4 is a graph in which the horizontal axis is time and the vertical axis is the voltage value. FIG. 4 shows a case where mounting head 28 is exchanged at time t1. When mounting head 28 is exchanged, connectors 174, 175 and connectors 184, 185 are disconnected, and connectors 175, 185 of the new mounting head 28 are connected. When this occurs, dust or the like may adhere to connectors 174, 184. When dust adheres, the output amount of the optical signal transmitted by fiber-optic cables 173, 183 is reduced. That is, as shown in FIG. 4, there may be a case in which a change occurs, before and after time t1, in which the voltage greatly decreases or the like. Therefore, in step S1, CPU 142 reads not all the voltage values stored in storage section 145 but only the voltage values from the time of exchanging to the current time. Next, in S3, CPU 142 calculates the slope of the voltage values with respect to time using, for example, the least squares method. In addition, CPU 142 calculates time t2 at which the voltage value will become equal to or lower than the threshold value based on the calculated slope. Here, the threshold value is, for example, a value based on a standard value of a light output amount at which optical communication is assured and is stored in advance, for example, storage section 145. Further, CPU 142 converts calculated time t2 to, for example, a time period expressed in months.

Returning to FIG. 3, next, CPU 142 displays the calculated time (S5). More specifically, a message such as, "Please perform maintenance in [Month][Year]", "Please perform maintenance after X months", or the like is displayed on display device 29. CPU 142 ends the time prediction process after executing step S5. In this way, the operator can perform maintenance of components involved in the optical communication from mounting head 28 to control device 140 before a communication failure occurs due to deterioration or the like of the components involved in the optical communication from mounting head 28 to control device 140. The components involved in the optical communication from mounting head 28 to control device 140 are electro-optical converter 163, fiber-optic cable 183, photoelectric converter 153, and AD converter 152.

Drive circuit 137 of mounting head 28 also executes a storage process of storing the voltage values outputted from AD converter 162 in association with time in storage section 138. Further, drive circuit 137 executes the same process as in steps S1 and S3 of the time prediction process. Drive circuit 137 reads the voltage values of the electrical signals stored in storage section 138, calculates the slope with respect to time of the voltage values. Further, drive circuit 137 calculates the time at which the voltage value will become equal to or less than the threshold value based on the slope and transmits the calculated time to control device 140. After the time is transmitted, CPU 142 converts the time to an expression in, for example, months, and then displays the time on display device 29 as in step S5. As a result, the operator can perform maintenance of the components involved in the optical communication from control device 140 to mounting head 28.

Here, mounting device 16 is an example of a work machine and a fixed unit, mounting head 28 is an example of a movable unit, fiber-optic cable 173 is an example of an optical transmission path and a second optical transmission path, fiber-optic cable 183 is an example of an optical transmission path and a first optical transmission path. Further, photoelectric converter 153 is an example of a first photoelectric converter, and photoelectric converter 161 is an example of a second photoelectric converter. Controller 141 is an example of a first detection section and a first estimation section. Drive circuit 137 is an example of a second detection section and a second estimation section. Further, mark camera 164 and side camera 165 are examples of a camera, and display device 29 is an example of a notification section. Further, the voltage value outputted by each of AD converter 152 and AD converter 162 is an example of a signal value.

With the embodiment described above, the following effects are obtained.

Controller 141 in the time prediction process estimates, based on the amount of decrease with time of the voltage value outputted from AD converter 152, the time at which the output value of the optical signal outputted from mounting head 28 will become equal to or less than the threshold. Specifically, controller 141 reads the voltage values of the electrical signal from storage section 145, calculates the slope with respect to time of the read voltage values, and then calculates the time at which the voltage value will become equal to or less than the threshold value. Thus, controller 141 estimates the time for performing maintenance of components involved in optical communication from mounting head 28 to control device 140. Further, controller 141 calculates the time at which the voltage value will become equal to or less than the threshold value based on the voltage values of the electric signal from the time at which the current mounting head 28 is attached to the current time. Therefore, the change in the voltage value caused by exchanging mounting head 28 is excluded, controller 141 can calculate the time at which the voltage value will become equal to or less than the threshold value based on the reduction in the voltage value due to deterioration over time of components involved in the optical communication from control device 140 to mounting head 28. Controller 141 can accurately calculate the time at which the voltage value will become equal to or less than the threshold value.

Further, drive circuit 137 estimates the time at which the output value of the outputted optical signal from control device 140 will become equal to or less than the threshold value based on the amount of decrease with time of the voltage value outputted from AD converter 162. With this, drive circuit 137 can estimate the time for performing maintenance of components involved in optical communication from control section 140 to mounting head 28.

In the time prediction process, controller 141 displays the calculated time on display device 29. As a result, the operator knows when to perform maintenance.

Mounting device 16 also has mounting head 28 for performing mounting work, and mounting head 28 has mark camera 164 and side camera 165. In such a configuration, it is advantageous to transmit image data at high speed by optical communication. Further, it is effective to estimate the time for performing maintenance with the time prediction process before a communication failure occurs. Further, a configuration in which drive circuit 137 performs the time prediction process is effective in a communication path configured with both fiber-optic cable 173 and fiber-optic cable 183.

It is needless to say that the present disclosure is not limited to the above-described embodiment, and various modifications and changes can be made within a range not departing from the spirit of the present disclosure.

For example, in the above, based on the amount of decrease with time of the signal value, a configuration in which the slope with respect to the elapsed time of the voltage value was calculated was described as a method for estimating the time at which the output value of an optical signal outputted from a movable unit will become equal to or less than the threshold value. However, the present disclosure is not limited to this, for example, a table of maintenance times for voltage values and the amount of decrease in voltage values within a predetermined period may be stored in advance, and by referring to the table, a time can be determined for performing maintenance based on the voltage values and the amount of decrease in voltage value within a predetermined period.

Further, in the above description, it has been described that in step S1 of the time prediction process, CPU 142 reads out the voltage values, stored in storage section 145, from the time of exchanging to the current time. When exchanging occurs, although the voltage value may change greatly due to adhesion of dust or the like as described earlier, there are also cases in which the voltage value does not change significantly. Therefore, not limiting to the above, a configuration is allowed in which step S3 is executed based on all the voltage values stored in storage section 145.

Further, in the above, it has been described that in step S1 of the time prediction process, CPU 142 reads out the voltages from the time of exchanging stored in storage section 145 to the current time. However, the present disclosure is not limited to this, and, for example, the history of voltage values stored in storage section 145 may be deleted and the history may be recorded anew each time mounting head 28 is exchanged.

Further, in the above, it has been described that drive circuit 137 reads out the voltage values of the electric signals stored in its storage section and then calculates the slope with respect to the time of the voltage values, but the present disclosure is not limited thereto. For example, a configuration may be adopted in which drive circuit 137 transmits the voltage values read to controller 141, and controller 141 calculates the slope.

In the above description, the voltage value is described as an example of a signal value, but a current value or a power value may also be used.

Although controller 141 has been described above as having CPU 142, controller 141 may have multiple CPUs. In this case, the first detection section and the first estimation section are not limited to a configuration in which one CPU is implemented, and a configuration may be adopted in which the first detection section and the first estimation section are implemented by separate CPUs or at least a part may be implemented by the same CPU.

Further, in the above, the content of the signal outputted to CPU 142 via fiber-optic fiber cable 183 or the like is described as image data captured by mark camera 164, and side camera 165 but the content is not limited thereto.

The content may be a signal, I/O signal, or the like from a motor sensor of positive and negative pressure supply device 52, nozzle lifting and lowering device 54, nozzle rotation device 56, or the like.

REFERENCE SIGNS LIST

16 Mounting device, 28 Mounting head, 29 Display device, 153, 161 Photoelectric converter, 173, 183 Fiber-optic cable, 137 Drive circuit, 141 Controller, 164 Mark camera, 165 Side camera

The invention claimed is:

1. A work machine, comprising:
a fixed unit,
a movable unit movably provided in the fixed unit,
an optical transmission path configured to transmit an optical signal between the fixed unit and the movable unit,
a first photoelectric converter configured to convert the optical signal outputted from the movable unit into an electrical signal,
a first detection section configured to detect the signal value of the electrical signal converted by the first photoelectric converter, and
a first estimation section configured to estimate a time at which the output value of the optical signal outputted from the movable unit becomes to be equal to or less than a threshold value based on the signal value of the electrical signal with time detected by the first detection section.

2. The work machine of claim 1, wherein the optical transmission line is a flexible cable.

3. The work machine of claim 1,
wherein the movable unit comprises:

a second photoelectric converter configured to convert the optical signal outputted from the fixed unit into an electrical signal, a second detection section configured to detect the signal value of the electrical signal converted by the second photoelectric converter, and a second estimation section configured to estimate a time at which the output value of the optical signal outputted from the fixed unit becomes to be equal to or less than a threshold value based on the signal value of the electrical signal with time detected by the second detection section.

4. The work machine of claim 1,
wherein the movable unit includes a camera, and
wherein the optical signal outputted from the movable unit is image data based on the image captured by the camera.

5. The work machine of claim 1, wherein the optical transmission path comprises:
a first optical transmission path configured to transmit the optical signal outputted from the movable unit, and
a second optical transmission path configured to transmit an optical signal outputted from the fixed unit.

6. The work machine of claim 1,
wherein the work machine further comprises a storage section configured to store the signal values; and
wherein the first estimation section is configured to estimate the time based on the slope of the signal values, being stored in the storage section, with time.

7. The work machine of claim 1,
wherein the work machine further comprises a slider, movably provided to the fixed unit, to which the movable unit is detachably attached; and
wherein the first estimation section is configured to estimate the time based on the signal values detected by the first detection section after the movable unit is attached to the slider.

8. The work machine of claim 1, wherein the work machine further comprises a notification section configured to send out a notification of the aforementioned time.

9. The work machine of claim 1, wherein the movable unit performs a mounting work of mounting an electronic component on a board.

* * * * *